(12) United States Patent
Reber et al.

(10) Patent No.: US 10,975,490 B2
(45) Date of Patent: Apr. 13, 2021

(54) APPARATUS AND METHOD FOR ETCHING ONE SIDE OF A SEMICONDUCTOR SUBSTRATE

(71) Applicant: NexWafe GmbH, Freiburg (DE)

(72) Inventors: Stefan Reber, Gundelfingen (DE); Kai Schillinger, Freiburg (DE)

(73) Assignee: NexWafe GmbH, Freiburg (DE)

( * ) Notice: Subject to any disclaimer, the term of this patent is extended or adjusted under 35 U.S.C. 154(b) by 66 days.

(21) Appl. No.: 16/061,145

(22) PCT Filed: Dec. 8, 2016

(86) PCT No.: PCT/EP2016/080327
§ 371 (c)(1),
(2) Date: Jun. 11, 2018

(87) PCT Pub. No.: WO2017/097933
PCT Pub. Date: Jun. 15, 2017

(65) Prior Publication Data
US 2018/0374723 A1 Dec. 27, 2018

(30) Foreign Application Priority Data
Dec. 11, 2015 (DE) .................... 10 2015 121 636.1

(51) Int. Cl.
*C25F 3/12* (2006.01)
*C25F 7/00* (2006.01)
(Continued)

(52) U.S. Cl.
CPC ............ *C25F 3/12* (2013.01); *C23C 16/0227* (2013.01); *C23C 16/4401* (2013.01);
(Continued)

(58) Field of Classification Search
CPC ........ C25F 3/12; C25F 7/00; H01L 21/67086; H01L 21/3063; H01L 21/6776
See application file for complete search history.

(56) References Cited

U.S. PATENT DOCUMENTS

| 7,569,124 B2 | 8/2009 | Yagi et al. |
| 9,399,818 B2 | 7/2016 | Reber et al. |
| (Continued) | | |

FOREIGN PATENT DOCUMENTS

| CN | 101815504 | 8/2010 |
| DE | 19936569 | 3/2001 |
| (Continued) | | |

OTHER PUBLICATIONS

E.V. Astrova, et al., "Anisotropy of the Porous Layer Formation Rate in Silicon with Various Acceptor Concentrations", Solid State Phenomena, vols. 205-206, pp. 370-375, Oct. 7, 2013, www.scientific.net.

*Primary Examiner* — Nicholas A Smith
(74) *Attorney, Agent, or Firm* — Volpe Koenig

(57) ABSTRACT

An apparatus for etching one side of a semiconductor layer, including at least one etching tank for receiving an electrolyte, a first electrode, which is arranged to make electrical contact with the electrolyte located in the etching tank during use, at least a second electrode, which is arranged to make indirect or direct electrical contact with the semiconductor layer, at least one electric current source, which is electrically conductively connected to the first and the second electrode to produce an etching current, and at least one transport apparatus for transporting the semiconductor layer relative to the etching tank in such a way that substantially only an etching side of the semiconductor layer that is to be etched can be wetted by the electrolyte located in the etching tank during use. The current source is formed as a variable current source, and that the apparatus has a (Continued)

controller for controlling the variable current source, wherein the apparatus is designed such that the etching current can be changed automatically by the controller during the etching operation. A method for etching one side of a semiconductor layer is also provided.

13 Claims, 4 Drawing Sheets

(51) Int. Cl.
*H01M 4/134* (2010.01)
*H01M 4/1395* (2010.01)
*H01L 21/677* (2006.01)
*H01L 21/306* (2006.01)
*H01L 21/67* (2006.01)
*C23C 16/02* (2006.01)
*C23C 16/44* (2006.01)
*C23C 16/458* (2006.01)
*C23C 16/54* (2006.01)
*C25D 7/12* (2006.01)

(52) U.S. Cl.
CPC .......... *C23C 16/4587* (2013.01); *C23C 16/54* (2013.01); *C25D 7/12* (2013.01); *C25F 7/00* (2013.01); *H01L 21/306* (2013.01); *H01L 21/30604* (2013.01); *H01L 21/6776* (2013.01); *H01L 21/67086* (2013.01); *H01M 4/134* (2013.01); *H01M 4/1395* (2013.01); *H01L 21/67706* (2013.01)

(56) References Cited

U.S. PATENT DOCUMENTS

| | | | |
|---|---|---|---|
| 9,418,865 B2 * | 8/2016 | Nowling | ........... H01L 21/31133 |
| 2005/0199511 A1 | 9/2005 | Kochergin et al. | |
| 2010/0196435 A1 * | 8/2010 | Freeman | .............. A61K 39/395 424/423 |
| 2012/0145553 A1 | 6/2012 | Kramer et al. | |
| 2013/0171808 A1 | 7/2013 | Moslehi et al. | |
| 2016/0211154 A1 | 7/2016 | Reber et al. | |
| 2016/0211218 A1 * | 7/2016 | Hara | ................. H01L 21/67282 |

FOREIGN PATENT DOCUMENTS

| | | | | |
|---|---|---|---|---|
| DE | 102006033353 | | 1/2008 | |
| DE | 102006033353 A1 * | | 1/2008 | ............ C25D 17/06 |
| DE | 10201322152 A1 * | | 4/2015 | |
| DE | 102013219839 | | 4/2015 | |
| DE | 102013219886 | | 4/2015 | |
| DE | 102013221522 | | 4/2015 | |
| JP | 07099342 | | 4/1995 | |
| JP | 2002100791 | | 4/2002 | |
| JP | 2005072059 | | 3/2005 | |
| WO | 2009009563 | | 1/2009 | |
| WO | 2013004851 | | 1/2013 | |

* cited by examiner

APPARATUS AND METHOD FOR ETCHING ONE SIDE OF A SEMICONDUCTOR SUBSTRATE

BACKGROUND

The invention relates to an apparatus and a method for etching one side of a semiconductor layer.

In the method for producing semiconductor wafers or semiconductor components it is often desirable to carry out an etching process at only one side of a semiconductor layer.

For this purpose, the side that is not to be etched can be provided with an etching protection layer, such that only the side that is not covered by the protection layer is processed in a subsequent etching process. However, a procedure of this type is complex in terms of method since the protection layer has to be applied and removed again.

Methods are known, therefore, in which only the side to be etched of the semiconductor layer is wetted with an electrolyte. A constant-current source generates an etching current between the electrolyte and the semiconductor layer, such that etching on one side is effected.

Such a method and an apparatus suitable therefor are known from DE 10 2013 219 886 A1. In this case, by the use of a transport apparatus, the semiconductor layer is moved over an electrolyte in an etching chamber in such a way that substantially only that side of the semiconductor layer which faces the electrolyte is wetted with the electrolyte.

There is a great need to extend the areas of application of the etching method described previously and to reduce the susceptibility to faults in order to enable use in industrial processes with a high throughput.

SUMMARY

Therefore, the present invention is based on the object of developing the previously known method and the previously known apparatus for etching one side of a semiconductor layer in which the susceptibility to faults is reduced and/or the areas of application are expanded.

This object is achieved by an apparatus for etching one side of a semiconductor layer and also by a method for etching one side of a semiconductor layer including one or more features of the invention.

The apparatus is preferably configured for carrying out the method according to the invention, in particular a preferred embodiment thereof. The method according to the invention is preferably configured to be carried out by the apparatus according to the invention, in particular a preferred embodiment thereof.

The apparatus according to the invention for etching one side of a semiconductor layer comprises an etching tank for receiving an electrolyte. Furthermore, the apparatus comprises a first electrode (for forming an anode), which is arranged for making electrical contact with the electrolyte situated in the etching tank during use, and also at least one second electrode (for forming a cathode), which is arranged for making indirect or direct electrical contact with the semiconductor layer.

The apparatus furthermore comprises at least one electric current source, which is electrically conductively connected to the first and second electrodes in order to generate an etching current. Furthermore, the apparatus comprises at least one transport apparatus for transporting the semiconductor layer relative to the etching tank. The transport is effected in such a way that substantially only an etching side to be etched of the semiconductor layer is wettable by the electrolyte situated in the etching tank during use.

In this case, the semiconductor layer to be etched can be a semiconductor slice, in particular a semiconductor wafer. The semiconductor layer can likewise be a semiconductor layer applied indirectly or directly on a carrier substrate.

The semiconductor layer can likewise be intrinsic or doped. The apparatus according to the invention and the method according to the invention are suitable in particular for etching one side of a silicon semiconductor layer and in particular a silicon wafer.

The electrolyte here is configured in such a way that in cooperation with the etching current that flows between the two electrodes and thus also between the electrolyte and the semiconductor layer, the semiconductor layer is etched at the region which are wetted with the electrolyte and in which the etching current flows.

What is essential is that the current source is configured as a variable current source, and that the apparatus comprises a controller for controlling the variable current source. In this case, the apparatus is configured in such a way that the etching current is automatically changeable by the controller during the etching process.

In the case of the apparatus according to the invention, the etching current is thus changed during the etching process, without this necessitating a manual intervention on the part of a user.

As a result, the field of use of the apparatus is extended and/or the susceptibility to faults is reduced:

Etching processes are typically dependent on the etching current at least with regard to the etching rate, such that automatically varying the etching current opens up a wide field of application for producing deliberately inhomogeneous layers, in particular layers or layer systems that are inhomogeneous in a direction perpendicular to the etching side of the semiconductor layer:

In this regard, the apparatus according to the invention is suitable in particular for porosifying the semiconductor layer at the etching side. This makes use of the circumstance that different etching rates are present in the depth direction (perpendicular to the etching surface) by comparison with lower etching rates in a direction parallel to the etching surface. It is known per se to produce porous surface layers at the semiconductor layer, in particular porous surface layers at silicon semiconductor layers, by such etching methods.

The apparatus according to the invention extends the application possibilities, then, by virtue of the fact that in the depth direction layers of different porosity can be formed by predefining an automatic etching current change during the etching process by the controller. In particular, a layer system comprising sublayers of alternately low and high porosity is preferably formed.

Such layer systems are preferably produced by cyclic modulation of the etching current by the controller, in particular by modulating a sinusoidal or rectangular profile thereon.

The controller is thus preferably configured in such a way that the etching current is controllable by predefining a temporal profile, in particular by predefining a temporally modulated, in particular sinusoidally or rectangularly modulated, etching current.

A further expansion of the field of application results by virtue of a variation of the etching current being effected during the transport of the semiconductor layer by the transport apparatus relative to the etching tank. As a result, it is possible to produce different layer properties in a lateral direction (i.e. in the transport direction). Likewise, it is possible to keep constant the etching current density (current per area through which current flows) for an area to be etched that is variable as a result of the transport, as described in detail further below.

The method according to the invention is configured for etching one side of a semiconductor layer using an etching current between an electrolyte and the semiconductor layer. In this case, the semiconductor layer is wetted substantially on one side by the electrolyte. What is essential is that the etching current is automatically varied during the etching process. This affords the advantages described above.

Investigations by the applicant have furthermore revealed that a frequent fault source during the further use of the semiconductor layer etched on one side occurs by virtue of the fact that inhomogeneities occur at the edges of the semiconductor layer in the transport direction. Extensive investigations have shown that when the semiconductor layer enters the etching tank, i.e. in an entry phase in which the semiconductor layer makes contact with the electrolyte for the first time by the transport apparatus and a first edge region of the semiconductor layer, said edge region lying at the front in the transport direction, is thus etched, particularly high etching current densities occur in the previously known apparatus and method. This is caused by the constant current flow impressed by constant-current sources with a variable area to be etched.

A similar effect occurs upon exit of the semiconductor layer. If the semiconductor layer is moved out again backward by changing the transport direction, this effect occurs once again at the edge already described above. Typically, however, the semiconductor layer is moved across the etching tank, such that the above-described edge lying at the front in the transport direction is the first to exit the etching tank and an edge lying opposite said edge and lying at the back in the transport direction leaves the etching tank at the end of the processing process and the connection between the electrolyte and the semiconductor layer is released at this edge. At this back edge, too, in accordance with investigations by the applicant, inhomogeneities occur on account of greatly increasing etching current densities.

In one particularly advantageous embodiment, the controller is thus configured in such a way that the etching current is predefinable by predefining an etching current that increases at the beginning of the etching process and/or subsides at the end of the etching process. Preferably, both an etching current that increases at the beginning of the etching process and an etching current that subsides at the end of the etching process are predefined; preferably, the current flow is modulated in such a way that a uniform etching current density is obtained.

As a result, the etching current can be predefined upon entrance of the semiconductor layer into the etching tank and/or upon exit from the etching tank in such a way that a homogenous etching process is effected over the entire area of the semiconductor layer and, consequently, the edge regions lying at the front and back in the transport direction no longer have the previously occurring inhomogeneities.

In this case, the change in the etching current is preferably effected by predefining a rising ramp upon entrance into the etching tank and correspondingly a decreasing ramp upon exit from the etching tank. In particular, a continuously rising etching current is preferably predefined upon entrance into the tank and a continuously decreasing etching current is preferably predefined upon exit from the tank. In this case, the semiconductor layers to be etched have a preferred length of 100 mm to 1500 mm, in particular of 150 to 250 mm. In this case, the magnitude of the etching current in the course of the ramp is preferably linked to the area proportion of the semiconductor layer already or still situated in the etching tank in comparison with the semiconductor layer maximally etchable in the etching tank. In this case, for example with a semiconductor layer having a length of 156 mm, the etching currents used vary from 0 to 50 A, in particular from 0 to 30 A.

Preferably, a plateau phase with constant etching current is predefined between the increasing and the subsiding profile of the etching current. An intermediate phase typically arises during movement of the semiconductor layer relative to the etching chamber, in which intermediate phase the size of that area of the semiconductor layer which is wetted by the electrolyte does not change. This may stem from the fact that the length of the semiconductor layer in the transport direction is greater than the corresponding length of the etching chamber and in the intermediate phase the semiconductor layer thus completely covers the etching chamber at least in the transport direction. Such an intermediate phase can likewise occur if the length of the etching chamber in the transport direction is greater than the corresponding length of the semiconductor layer and in the intermediate phase the semiconductor layer is thus completely wetted with the electrolyte at least in the transport direction.

Advantageously, a constant etching current is predefined for the intermediate phase since the wetted area does not change in the intermediate phase.

In one advantageous configuration, inhomogeneities are avoided upon entrance and/or upon exit by virtue of the fact that upon entrance the etching current rises, in particular preferably rises proportionally to the area wetted by the electrolyte. Alternatively or in particular preferably additionally, the etching current decreases upon exit, in particular preferably proportionally to the area covered by the electrolyte.

Upon simultaneous entrance and exit of a plurality of semiconductor layers into/from an etching tank, in one advantageous configuration the etching current is modulated such that, by superposition of the respective increasing and subsiding etching currents, an etching current density that is constant at any time is ensured on the semiconductor layers. This is advantageously applied for example in the case of semiconductor layers entering and exiting the etching tank at a distance from one another if the distance is less than the length of the etching tank. In this case, upon exit of the first semiconductor layer the etching current is reduced proportionally to the decreasing area in the manner already described, as soon as a second semiconductor layer enters the etching tank the etching current is kept constant, and as soon as the first semiconductor layer has completely left the etching tank the etching current is increased area-proportionally until the second semiconductor layer covers the entire area of the etching tank and the etching current is then kept constant. As a result, the etching current can be predefined at any time in such a way that a homogenous etching process is effected over the entire area of the semiconductor layers and, consequently, the edge regions lying at the front and back in the transport direction no longer have the previously occurring inhomogeneities.

In particular, it is thus advantageous to vary the etching current proportionally to the semiconductor area wetted in the etching tank, wherein the wetted semiconductor area is the total wetted semiconductor area, which can be additively comprised of partial areas of a plurality of semiconductor layers if at least in part two or more semiconductor layers are simultaneously wetted by the electrolyte in the etching tank.

If the temporal sequence during the transport of the semiconductor layer by the transport apparatus is known, the desired effect can be achieved and/or the desired homogeneity can be ensured by predefining a temporal profile of the etching current.

In one advantageous embodiment, the controller of the apparatus is configured in such a way that the etching current is controllable depending on a control signal, in particular a detector signal. As a result, the predefined temporal profile can be triggered by the control signal. In particular, it is advantageous that a position detector for detecting at least one positioning of the semiconductor layer relative to the etching tank is provided, and that the position sensor is configured to cooperate with the controller in order to transmit a trigger signal for starting the predefined temporal profile of the etching current to the controller.

Such a position sensor can be configured as a mechanical switch in a manner known per se. Preferably, the position sensor is configured as a non-contact position sensor, in particular preferably as a light barrier.

The position sensor is preferably arranged upstream of the etching tank in the transport direction, such that the front edge in the transport direction is detected preferably directly or shortly before entering the etching tank and thus shortly before the front edge is wetted with the electrolyte. It likewise lies within the scope of the invention to arrange the position sensor at a greater distance from the edge of the etching tank. In particular given knowledge of the transport speed and in particular preferably given a constant transport speed, it is possible to calculate by the corresponding time offset between detection of the front edge of the semiconductor layer and entry of said edge into the etching tank. Furthermore, preferably by detecting the front edge (a front edge in the transport direction) and the end edge (a back edge in the transport direction) of the semiconductor layer, the transport speed and also the length of the semiconductor layer will be determined; in particular, preferably the current ramp is thus explicitly adapted to each semiconductor layer.

In one advantageous configuration, the apparatus comprises at least one further sensor for determining geometric or material properties or for determining the identity of the semiconductor layer. The measurement values of said at least one further sensor are used by a suitable processing unit, in particular the controller, to adapt the profile of the etching current, in particular the maximum magnitude thereof, to the properties of the semiconductor layer.

By way of example, in one advantageous embodiment, a sensor for determining the conductivity of the semiconductor layer is used to adapt the etching current on the basis of the measurement value so as to keep constant the etching rate, which is dependent on the conductivity. In this same way, a sensor for determining the area of the semiconductor layer is used to set the etching current area-proportionally in order to achieve a constant etching current density. The dependence of the etching rate on the conductivity is known for example from E. V. Astrova, Y. A. Zharova, "Anisotropy of the Porous Layer Formation Rate in Silicon with Various Acceptor Concentrations", Solid State Phenomena, Vols. 205-206, pp. 370-375, October 2013.

In order to achieve an optimum homogeneity, the apparatus is preferably configured in such a way that the etching current density at the semiconductor layer is constant during the etching process, such that per unit area and independently of the position of the semiconductor layer approximately the same etching current always takes effect, which in conjunction with uniform speed and thus the same etching time ensures the desired optimum homogeneity.

In a further preferred embodiment, the temporally modulated etching current is combined with a rise in the etching current upon entrance of the semiconductor layer into the etching chamber and/or a decrease in the etching current upon exit of the semiconductor layer from the etching chamber. In this preferred embodiment, the temporal modulation, in particular preferably a sinusoidal, rectangular, triangular or sawtooth-like modulation, is thus superimposed on a rising ramp upon entrance, a middle plateau and a decreasing ramp upon exit of the wafer.

In this preferred embodiment, the etching current thus increases on average over time upon entrance of the semiconductor layer and/or the etching current decreases on average over time upon exit of the semiconductor layer.

The apparatus according to the invention and the method according to the invention are in particular preferably suitable for producing a porous semiconductor layer or at least one porous surface at the semiconductor layer as described above.

In particular, it is advantageous, with the apparatus according to the invention and/or with the method according to the invention, to form a carrier substrate for an epitaxial deposition of a semiconductor layer, in particular for an epitaxial deposition of a silicon layer.

Such a method, in which firstly a carrier substrate is prepared by forming a porous surface on one side by etching, then a silicon layer is formed epitaxially on the porous surface, which silicon layer is finally detached from the carrier substrate in order to produce a semiconductor component, in particular a photovoltaic solar cell, is described in WO 2013/004851 A1.

The method according to the invention and the apparatus according to the invention are suitable in particular for forming a porous surface at a carrier substrate for the epitaxial growth of a silicon layer as described above.

The etching current is preferably chosen in such a way that an etching current density in the range of 0.1 mA/cm$^2$ to 1000 mA/cm$^2$, in particular preferably in the range of 5 mA/cm$^2$ to 500 mA/cm$^2$, results.

In order to achieve an advantageous etching effect, the following configurations of the electrolyte are advantageous:

In order to produce porous silicon: 30% to 80% deionized water, 19% to 49% hydrofluoric acid, remainder surfactant (e.g. ethanol), e.g. 36% deionized water, 49% hydrofluoric acid, 15% ethanol. Alternative dissociating compounds containing fluorine, chlorine or other halogens can be used instead of hydrofluoric acid.

Chlorine-containing electrolytes, e.g. hydrochloric acid, are preferred for producing porous gallium arsenide, hydroxyl-containing electrolytes, e.g. potassium hydroxide solution, are preferred for producing porous indium phosphide, and electrolytes containing hydrofluoric acid are preferred for producing porous silicon carbide.

In the case of the apparatus according to the invention and the method according to the invention, the current flow of the etching current is effected from the first electrode via the electrolyte to the semiconductor layer. It lies within the scope of the invention for the second electrode to make indirect or direct mechanical contact with the semiconductor layer. One advantageous embodiment of such a contact is for example a resiliently mounted sliding-action contact comprising graphite or metal brushes.

It likewise lies within the scope of the invention to provide other types of contacting for electrically contacting the semiconductor layer with the second electrode, in particular to choose one of the embodiments described in DE 10 2013 219 839 A1.

Advantageously, in the transport direction at least upstream of the etching tank a first contacting tank (for forming a cathode) is provided, which during use is filled with a contacting electrolyte, preferably the electrolyte identical to that used in the etching tank. In this advantageous embodiment, the second electrode (for forming an anode) is arranged for making electrical contact with the contact liquid situated in the contacting tank during use.

The transport apparatus in this case is preferably arranged and configured in such a way that the semiconductor layer is at least wetted firstly with the contact liquid of the cathode tank. In particular, it is advantageous, in the same way as in the case of the etching tank, too, to transport the semiconductor layer by the transport apparatus in such a way that substantially only the side to be etched of the semiconductor layer is wetted by the contact liquid situated in the contact tank during use. Upon entrance of the semiconductor layer into the etching tank, the semiconductor layer is thus wetted beginning at the front edge by the electrolyte situated in the etching tank (anode), whereas the remaining region of the semiconductor layer is still wetted by the contact liquid of the contact tank (cathode). As a result, electrical contact is thus made with the semiconductor layer firstly by the first electrode by the electrolyte and secondly by the second electrode by the contact liquid, such that the etching process can be started by forming an etching current.

It is particularly advantageous to provide downstream of the etching tank in the transport direction a second contacting tank (for forming a cathode), which is likewise filled with contact liquid during use. A third electrode (for forming a second cathode) for making contact with the contact liquid situated in the second contacting tank during use is arranged in the second contacting tank. The second cathode is likewise electrically conductively connected to the current source with the same polarity as the first cathode. In particular, it is advantageous for both cathodes to be electrically conductively connected.

This affords the advantage that upon exit of the semiconductor layer from the etching tank the semiconductor layer enters the second cathode tank, such that the flowing of the etching current via the anode and the second cathode is then ensured.

Advantageously, the etching tank has in the transport direction a length that is less than the length of the semiconductor layer in the transport direction, such that a region of the semiconductor layer always projects beyond a back and/or front edge of the etching tank and a contacting as described above for forming the etching current can always be ensured in these projecting regions.

In particular, it is advantageous that that edge of the first cathode tank which faces the etching tank and that edge of the second cathode tank which faces the etching tank parallel to the transport direction are at a distance that is less than the length of the semiconductor layer in the transport direction.

The method according to the invention and the apparatus according to the invention are suitable in particular for an etching depth in the range of 0.01 µm to 2000 µm, preferably of 0.1 µm to 50 µm. In particular with the use of the apparatus according to the invention and the method according to the invention for producing a porous surface of the semiconductor layer, a porous region having a depth in the range of 0.5 µm to 5 µm is preferably produced. The parameter ranges for etching current, the configuration of the electrodes, etching chambers, transport apparatus and of the electrolyte can be implemented in a manner known per se, in particular as described in DE 10 2013 219 886 A1.

BRIEF DESCRIPTION OF THE DRAWINGS

Further preferred features and embodiments are described below on the basis of exemplary embodiments and with reference to the figures, in which.

DETAILED DESCRIPTION

All the figures show schematic illustrations that are not true to scale. Identical reference signs in the figures designate identical or identically acting elements.

Figure 1:
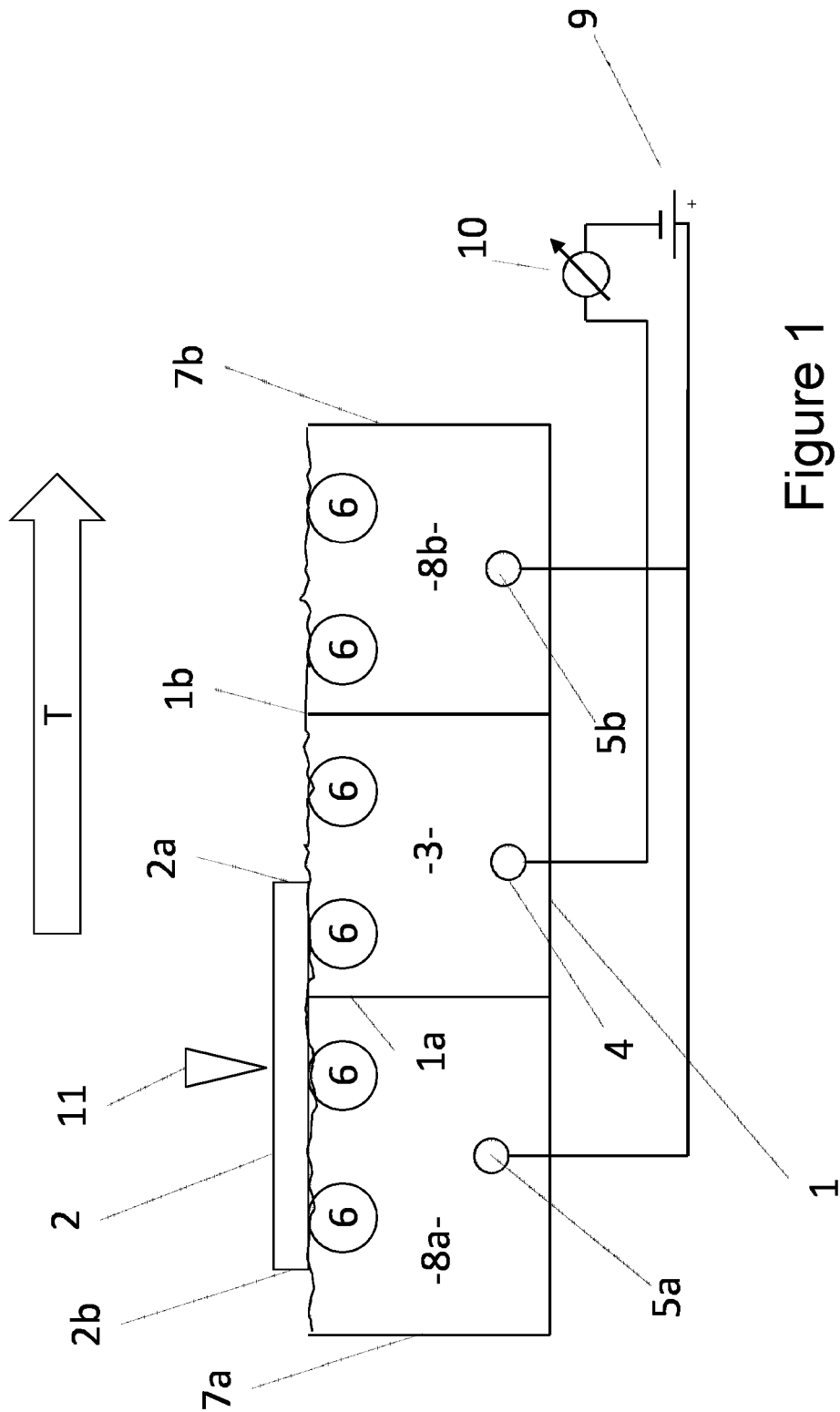
FIG. 1 shows a first exemplary embodiment of an apparatus according to the invention comprising two contacting chambers.

FIG. 1 illustrates a first exemplary embodiment of an apparatus according to the invention for etching one side of a semiconductor layer 2. The semiconductor layer 2 is configured as a silicon wafer having a thickness of 100 µm to 1500 µm in the present case 750 µm, and a doping of $1 \times 10^{15}$ atoms/cm$^3$ to $1 \times 10^{20}$ atoms/cm$^3$, in the present case $5 \times 10^{18}$ atoms/cm$^3$, doped with either boron or phosphorus, in the present case boron. A porous surface is intended to be produced on the bottom surface of the semiconductor layer 2, such that the semiconductor layer 2 can be used as a carrier substrate for the epitaxial growth of a silicon layer.

The silicon layer produced in this way and subsequently detached from the semiconductor layer 2 serves for producing a semiconductor component, in particular for producing a photovoltaic solar cell.

The apparatus comprises an etching tank 1 (anode), which is filled with an electrolyte 3, having the following composition: 30% to 80%, in the present case, 40%, $H_2O$; 19% to 49%, in the present case, 40%, HF; remainder, in the present case 20%, surfactant (e.g. ethanol).

A first electrode 4 is arranged in the etching tank 1 in order to make electrical contact with the electrolyte 3.

The apparatus furthermore comprises a transport apparatus, transport rollers 6 of which are merely illustrated schematically for the sake of better clarity. By use of the transport rollers 6, which are rotated in the same sense and at the same speed by a motor drive (not illustrated), the semiconductor layer 2 is moved in a transport direction T, i.e. from left to right in the illustration in accordance with FIG. 1.

Directly adjoining the etching tank 1 in the transport direction there is arranged a respective contacting tank (cathode) 7a (upstream of the etching tank in the transport direction) and 7b (downstream of the etching tank in the transport direction). The contacting tanks are each filled with contacting liquid 8a, 8b, which in the exemplary application is identical to the contacting liquid in the etching tank 1 (anode).

A second electrode 5a (cathode 1) is arranged in the contacting tank 7a and a third electrode 5b (cathode 2) is arranged in the contacting tank 7b, in each case for making electrical contact with the contacting liquid (8a, 8b).

The apparatus furthermore comprises a current source 9, which is electrically conductively connected at one end to the first electrode 4 (anode) and at the other end to the second electrode 5a (cathode 1) and the third electrode 5b (cathode 2). Accordingly, both cathodes are electrically conductively connected to one another.

If the semiconductor layer 2 is then moved in the transport direction T by the transport apparatus, substantially only the bottom side of the semiconductor layer 2 is wetted by the contacting liquid 8a, 8b or respectively the electrolyte 3. Due to a voltage potential between the anode (electrode 4) and one of the cathodes (electrode 5a and electrode 5b), an etching current is thus generated via the electrolyte 3 and the contacting liquids.

What is essential, then, is that the current supply is configured as a variable current source and a controller 10 is provided. The controller is configured to cooperate with the variable current source in order to automatically change the etching current during the etching process.

A change in the etching current is thus predefinable by the controller 10, in particular by predefining a temporal profile and/or by predefining a change in the etching current depending on trigger signals such as sensor data, for example.

As a result, susceptibilities to faults can be reduced, in particular as a result of an increase in the homogeneity of the etching process, and/or a wider field of application compared with previously known apparatuses can be opened up. This will be explained below with reference to FIGS. 3 to 6.

Figure 2:
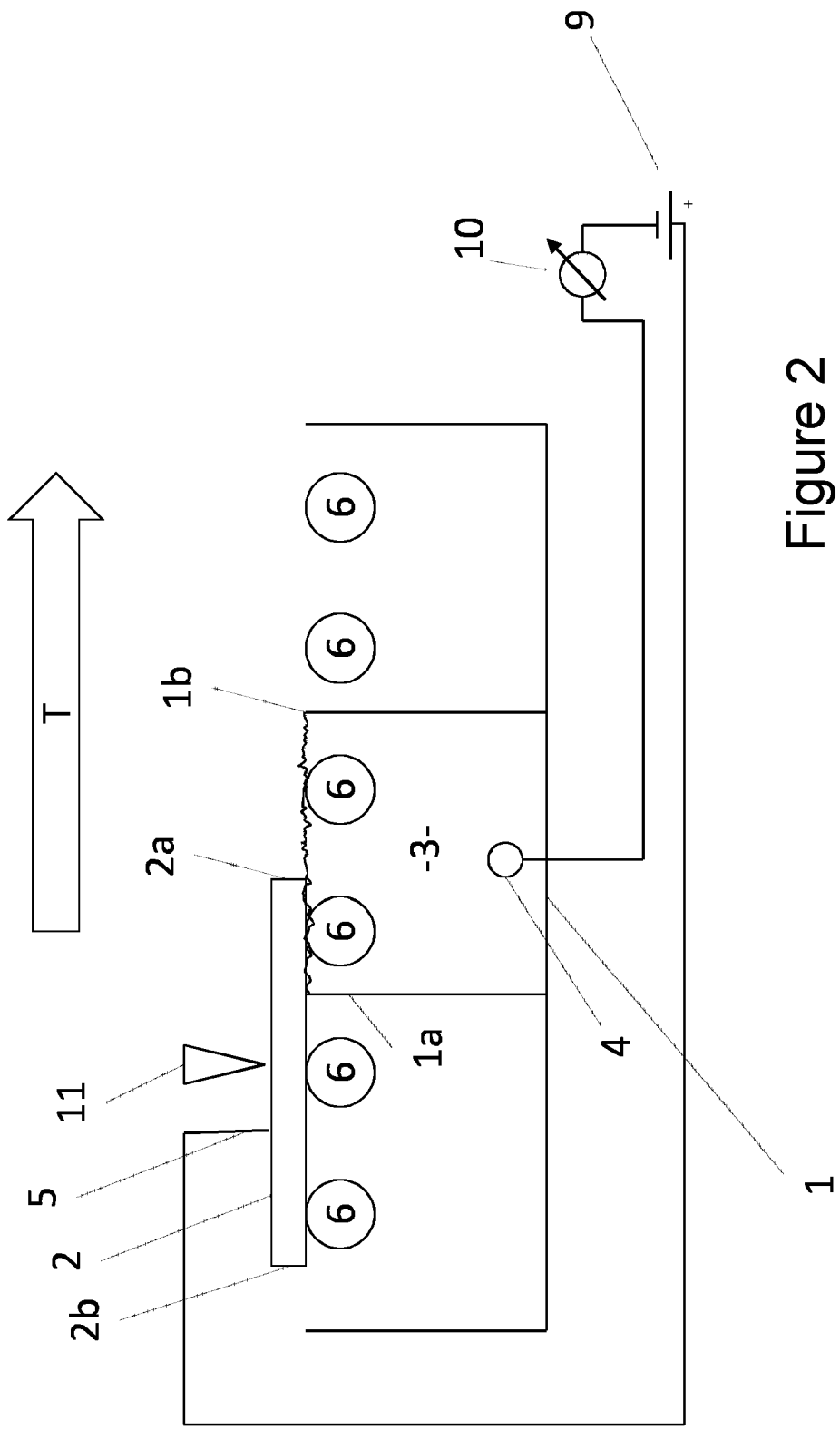
FIG. 2 shows a second exemplary embodiment of an apparatus according to the invention comprising three etching chambers.

FIG. 2 shows a second exemplary embodiment of an apparatus according to the invention. In order to avoid repetitions, only the essential differences with respect to the apparatus illustrated in FIG. 1 are discussed below:

In the case of the apparatus in accordance with FIG. 2, the semiconductor layer 2 is directly contacted by a second electrode 5 (cathode). Said cathode (electrode 5) is thus positionally fixed at the semiconductor layer and travels concomitantly during the transport process in the transport direction T.

The apparatus in accordance with FIG. 2 comprises an etching tank 1, which is filled with an electrolyte 3. The electrolyte 3 in the etching tank 1 is contacted via the electrode (anode) 4. The composition of said electrolyte is as follows: 30% to 80% $H_2O$; 19% to 49% HF; remainder surfactant (e.g. ethanol).

The variable current source 9 is thus electrically conductively connected at one end to the electrode (anodes) 4. At the other end the current source 9 is electrically conductively connected to the second electrode 5 (cathode).

The apparatuses in accordance with FIG. 1 and FIG. 2 additionally comprise a position sensor 11 configured as a light barrier. By use of the position sensor 11 it is thus possible to detect when a front edge 2a of the semiconductor layer in the transport direction reaches the location of the position sensor 11. The position sensor 11 is connected to the controller 10 in order to transmit a trigger signal to the controller 10.

In a first exemplary embodiment of a method according to the invention, by use of the apparatus in accordance with FIG. 1, an etching current is formed between the electrolyte 3 and the semiconductor layer 2 in order to etch one side of the semiconductor layer 2 at the side facing the electrolyte. In this case—as described above—the semiconductor layer is wetted substantially on one side by the electrolyte. What is essential is that the etching current is automatically varied by the controller 10 during the etching process.

Further exemplary embodiments of a method according to the invention are explained below with reference to FIGS. 3 to 6:

Investigations by the applicant have shown that in particular upon entrance of the semiconductor layer 2 into the etching tank 1 and upon exit from the etching tank 1, severe inhomogeneities occur in the etching process; in particular, a great rise in the etching current density was able to be ascertained in these regions.

FIGS. 3 to 5 and 7 in each case show schematically illustrated temporal profiles of the etching current. Time t is always plotted on the X-axis, and the etching current I on the Y-axis.

Figure 3:
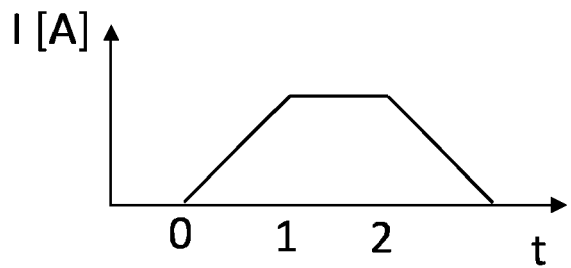
FIG. 3 shows a schematically illustrated temporal profile of the etching current for achieving a homogenous etching effect.

In a first exemplary embodiment of a method according to the invention, a temporal profile of the etching current I in accordance with FIG. 3 is therefore predefined.

In this exemplary embodiment of the method according to the invention, at a point in time t=0, if the front edge 2a of the semiconductor layer 2 enters the etching tank 1, i.e. crosses the edge of the etching tank 1 and is thus wetted by the electrolyte 3 for the first time, the etching current rises continuously in a ramp-like manner until a point in time t=1. This point in time t=1 represents the situation in which the front edge 2a of the semiconductor layer 2 reaches the back edge 1b of the etching tank 1. At this point in time t=1, the semiconductor layer 2 thus completely covers the etching tank 1 at least in the transport direction T.

As evident in FIG. 3, a plateau profile of the etching current then ensues, that is to say that the etching current is kept constant until a point in time t=2. The point in time t=2 is that point in time at which the back edge 2b of the semiconductor layer 2 reaches the front edge 1a of the etching tank 1. Starting from the point in time t=2, therefore, the etching tank (at least in the transport direction T) is no longer completely covered by the semiconductor layer 2. As evident in FIG. 3, starting from this point in time t=2, the etching current I decreases continuously in a ramp-like manner.

In this way, it is possible to achieve a considerable improvement in the homogeneity of the etching effect in particular laterally in the transport direction, such that upon the further use of the semiconductor layer 2 previously occurring faults can be avoided or at least considerably reduced.

By way of example, given a feed rate of 100 cm/min, an etching tank length of 5 cm and a length of the semiconductor layer composed of silicon of 15 cm upon entrance into the etching tank the current is increased linearly from 0 A to 10 A over 3 s, then kept constant for 3 s, and subsequently reduced from 10 A to 0 A for 3 s. This method produces an approximately 0.5 µm thick porous silicon layer of homogeneous thickness.

Figure 4:
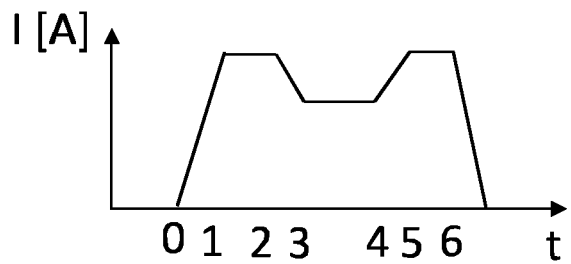
FIG. 4 shows a schematically illustrated temporal profile of the etching current for achieving a laterally different etching effect.

FIG. 4 illustrates a second exemplary embodiment of a method according to the invention for deliberately producing laterally different etching effects:

In this exemplary embodiment of the method according to the invention, at a point in time t=0, if the front edge 2a of the semiconductor layer 2 enters the etching tank 1, i.e.

crosses the edge of the etching tank 1 and is thus wetted by the electrolyte 3 for the first time, the etching current rises continuously in a ramp-like manner until a point in time t=1. This point in time t=1 represents the situation in which the front edge 2*a* of the semiconductor layer 2 reaches the back edge 1*b* of the etching tank 1. At this point in time t=1, the semiconductor layer 2 thus completely covers the etching tank 1 at least in the transport direction T.

As evident in FIG. 4, a plateau profile of the etching current then ensues, that is to say that the etching current is kept constant until a point in time t=2. Starting from the point in time t=2, the etching current is varied, reduced in this exemplary application, until the point in time t=3. The reduced etching current is kept constant until the point in time t=4 and then increased in a ramplike manner until it has reached the original level at the point in time t=5. This level is kept constant until the point in time t=6. The point in time t=6 is that point in time at which the back edge 2*b* of the semiconductor layer 2 reaches the front edge 1*a* of the etching tank 1. Starting from the point in time t=6, therefore, the etching tank (at least in the transport direction T) is no longer completely covered by the semiconductor layer 2. As evident in FIG. 4, starting from this point in time t=6, the etching current I decreases continuously in a ramp-like manner.

A porous region that is more highly pronounced at the edge regions of the semiconductor layer can be produced in this way. This is advantageous in particular for the effect of the porous layer as a separating layer in order to separate a semiconductor layer applied epitaxially on the etched layer from the semiconductor layer 2, as described in WO 2013/004851 A1. Alternatively, a deliberate adhesion of the epitaxially produced semiconductor layer can also be achieved in the edge regions by reducing the current level between t=1 and t=2, and also between t=5 and t=6, below the level present between t=3 and t=4.

Figure 5:
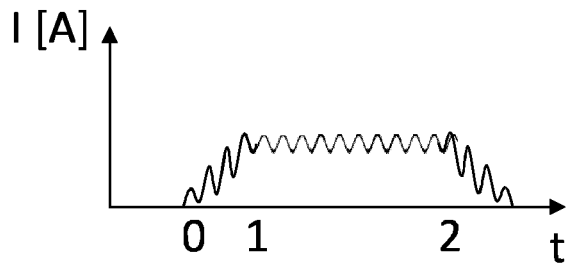
FIG. 5 shows a schematically illustrated temporal profile of a sinusoidally modulated etching current.
Figure 6:
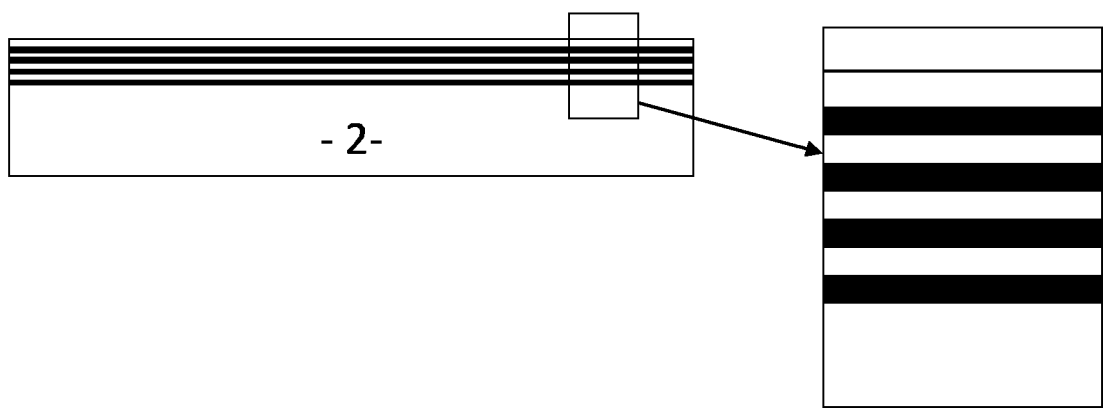
FIG. 6 shows the result of a surface processing with the current profile illustrated in FIG. 5.

FIG. 5 illustrates the variation of the etching current in a further exemplary embodiment of a method according to the invention:

In this exemplary embodiment, the etching current progresses on average as illustrated in FIG. 3. In addition, however, the etching current is sinusoidally modulated, wherein the amplitude of the sinusoidal modulation is smaller than the plateau height between the points in time t=1 and t=2. In this method, too, a porous region is produced at the surface of the semiconductor layer. On account of the sinusoidal modulation, in this case, however, a layer system comprising layers having alternately higher and lower density that lie one above another is produced, as shown in FIG. 6:

FIG. 6 shows a semiconductor layer 2, that has been treated by the method described above, for example in an apparatus in accordance with FIG. 1. The etching side lying at the bottom when the method is carried out, the porous layers being produced at said etching side, is illustrated at the top in FIG. 6. An enlarged excerpt is shown in the partial figure on the right. The white layers here represent layers having a low density, in the case of which more material was thus etched away by a higher etching current. The layers shown black have a higher density by comparison therewith, since less material was etched away on account of a lower etching current.

As a result, significantly thinner plies having varying density can be obtained since significantly shorter etching times e.g. in the range <0.1 s are produced. With an unregulated etching current these times can be realized only by very high passage speeds. These speeds cannot be realized in practice.

Such a layer, usable as an optical reflector, for example, is produced e.g. by a sinusoidal modulation of the etching current with a frequency preferably in the range of 0.01 Hz to 500 Hz, in the present case preferably 0.2 Hz, with respective thicknesses of the individual plies of approximately 100 nm. Layers produced with a higher frequency of e.g. 1 Hz-100 Hz are advantageously suitable e.g. as an electrode for silicon-lithium batteries, with respective thicknesses of the individual plies of from less than 1 nm to a few 10 nm.

Continuously increasing the intensity of the modulated current oscillation produces a ply structure that is able gradually to dissipate mechanical stress produced by strain and to produce a low-stress surface ply as a result.

Such current conduction, for example in a manner adapted in frequency such that thicknesses of individual plies in the range e.g. of optical wavelengths arise, produces structures having individual plies whose thickness continuously increases, so-called chirped Bragg reflectors, which exhibit particularly broadband reflection.

Figure 7:
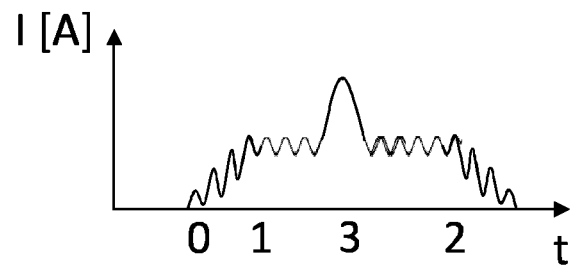
FIG. 7 shows a schematically illustrated temporal profile of a sinusoidally modulated etching current with an intervening current peak.

By supplementing the current profile shown in FIG. 5 with one or more peaks as shown in FIG. 7, two or more individual plies are produced which inherently have in turn an individual-ply structure. These can advantageously be embodied such that they can be mechanically separated from one another, e.g. for use as electrodes for silicon-lithium batteries.

The invention claimed is:

1. An apparatus for etching one side of a semiconductor layer, comprising:
    at least one etching tank (1) for receiving an electrolyte (3),
    a first electrode, which is arranged for making electrical contact with the electrolyte (3) situated in the etching tank (1) during use,
    at least one second electrode, which is arranged for making indirect or direct electrical contact with the semiconductor layer,
    at least one electric current source (9), which is electrically conductively connected to the first and second electrodes to generate an etching current,
    at least one transport apparatus that transports the semiconductor layer relative to the etching tank (1) in such a way that substantially only an etching side to be etched of the semiconductor layer is wettable by the electrolyte situated in the etching tank (1) during use,
    the current source (9) is configured as a variable current source (9),
    a controller (10) that controls the variable current source (9) such that the etching current is automatically changeable by the controller (10) during an etching process, and
    a sensor for detecting at least one of a surface area or material properties of the semiconductor layer, wherein the sensor for detecting the surface area is configured to cooperate with the controller (10) in order to control the etching current depending on the sensor data in order to achieve a constant etching current density, and wherein the sensor for detecting material properties is configured to cooperate with the controller (10) in order to control the etching current depending on the sensor data in order to achieve a constant etching rate.

2. The apparatus as claimed in claim 1, wherein the controller (10) is configured in such a way that the etching current is controllable by predefining at least one of a temporal profile, or a temporally modulated characteristic is a sinusoidally modulated characteristic.

3. The apparatus as claimed in claim 1, wherein the controller (10) is configured in such a way that the etching current is controllable depending on a control signal.

4. The apparatus as claimed in claim 1, further comprising a position sensor (11) for detecting at least one positioning of the semiconductor layer relative to the etching tank (1), and the position sensor (11) is configured to cooperate with the controller (10).

5. The apparatus as claimed in claim 4, wherein the position sensor (11) is arranged and configured in such a way as to detect a position of the semiconductor layer before the semiconductor layer is wetted with the electrolyte (3) situated in the etching chamber during use.

6. A method for etching one side of a semiconductor layer, the method comprising:
using an etching current between an electrolyte (3) and the semiconductor layer,
wetting the semiconductor layer substantially on one side by the electrolyte (3),
automatically varying the etching current during the etching process, and
varying the etching current depending on a measurement parameter of at least one of a surface area or material properties of the semiconductor layer from at least one sensor.

7. The method as claimed in claim 6, further comprising effecting a cyclic modulation of the etching current in terms of time, and the cyclic modulation is a sinusoidal modulation.

8. The method as claimed in claim 6, further comprising moving the semiconductor layer over an etching chamber containing with the electrolyte (3) in such a way that the semiconductor layer is wetted substantially on one side by the electrolyte (3), and at least one of increasing the etching current upon entrance of the semiconductor layer or decreasing the etching current upon exit of the semiconductor layer.

9. The method as claimed in claim 6, further comprising varying the etching current depending on the position of the semiconductor layer with respect to the electrolyte (3).

10. The method as claimed in claim 7, wherein the etching current is cyclically modulated, and at least one of the etching current rises on average over time upon entrance of the semiconductor layer or the etching current decreases on average over time upon exit of the semiconductor layer.

11. The method as claimed in claim 6, further comprising producing a porous semiconductor layer.

12. The method as claimed in claim 6, further comprising producing a carrier substrate for an epitaxial deposition of a semiconductor layer.

13. The method as claimed in claim 8, wherein upon exit the etching current decreases continuously proportionally to an area covered by the electrolyte (3).

* * * * *